United States Patent
Shieh et al.

(10) Patent No.: US 8,377,743 B2
(45) Date of Patent: Feb. 19, 2013

(54) LASER ANNEALING OF METAL OXIDE SEMICONDUCTOR ON TEMPERATURE SENSITIVE SUBSTRATE FORMATIONS

(75) Inventors: Chan-Long Shieh, Paradise Valley, AZ (US); Hsing-Chung Lee, Calabasas, CA (US)

(73) Assignee: CBRITE Inc., Goleta, CA (US)

( * ) Notice: Subject to any disclaimer, the term of this patent is extended or adjusted under 35 U.S.C. 154(b) by 105 days.

(21) Appl. No.: 12/874,145

(22) Filed: Sep. 1, 2010

(65) Prior Publication Data

US 2011/0062431 A1   Mar. 17, 2011

Related U.S. Application Data

(63) Continuation-in-part of application No. 12/124,420, filed on May 21, 2008, now abandoned.

(51) Int. Cl.
*H01L 21/00* (2006.01)

(52) U.S. Cl. ............... 438/104; 438/796; 257/E21.704; 257/E21.372

(58) Field of Classification Search .......... 438/104, 438/796; 257/E21.704, E21.372, E21.618, 257/E21.475

See application file for complete search history.

(56) References Cited

U.S. PATENT DOCUMENTS

| | | | | |
|---|---|---|---|---|
| 5,817,550 A | * | 10/1998 | Carey et al. ............... | 438/166 |
| 6,063,698 A | * | 5/2000 | Tseng et al. ............... | 438/585 |
| 2003/0077886 A1 | * | 4/2003 | Machida et al. ............... | 438/535 |
| 2004/0229412 A1 | * | 11/2004 | Wagner et al. ............... | 438/154 |
| 2005/0103255 A1 | * | 5/2005 | Voutsas et al. ............... | 117/3 |
| 2005/0158995 A1 | * | 7/2005 | Sposili et al. ............... | 438/663 |
| 2006/0054077 A1 | * | 3/2006 | Voutsas et al. ............... | 117/3 |
| 2006/0220023 A1 | * | 10/2006 | Hoffman et al. ............... | 257/72 |
| 2008/0296567 A1 | * | 12/2008 | Irving et al. ............... | 257/43 |
| 2009/0179199 A1 | * | 7/2009 | Sano et al. ............... | 257/43 |

OTHER PUBLICATIONS

R. Martins, et al "Transport in high mobility amorphous wide band gap indium zinc oxide films", Phys. Stat. Sol. (a) 202, No. 9, pp. R96-R97 (2005).*

* cited by examiner

*Primary Examiner* — Caridad Everhart
(74) *Attorney, Agent, or Firm* — Parsons & Goltry; Robert A. Parsons; Michael W. Goltry

(57) ABSTRACT

A method of annealing a metal oxide on a temperature sensitive substrate formation includes the steps of providing a temperature sensitive substrate formation and forming a spacer layer on a surface of the substrate formation. A metal oxide semiconductor device is formed on the spacer layer, the device includes at least a layer of amorphous metal oxide semiconductor material, an interface of the amorphous metal oxide layer with a dielectric layer, and a gate metal layer adjacent the layer of amorphous metal oxide semiconductor material and the interface. The method then includes the step of at least partially annealing the layer of metal oxide semiconductor material by heating the adjacent gate metal layer with pulses of infra red radiation to improve the mobility and operating stability of the amorphous metal oxide semiconductor material while retaining at least the amorphous metal oxide semiconductor material adjacent the gate metal layer amorphous.

24 Claims, 1 Drawing Sheet

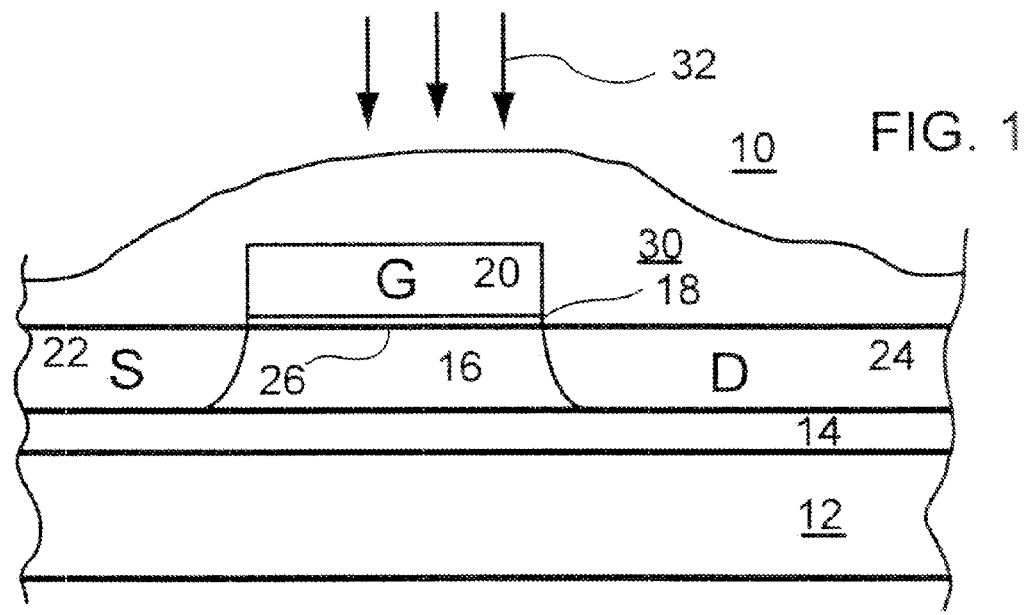
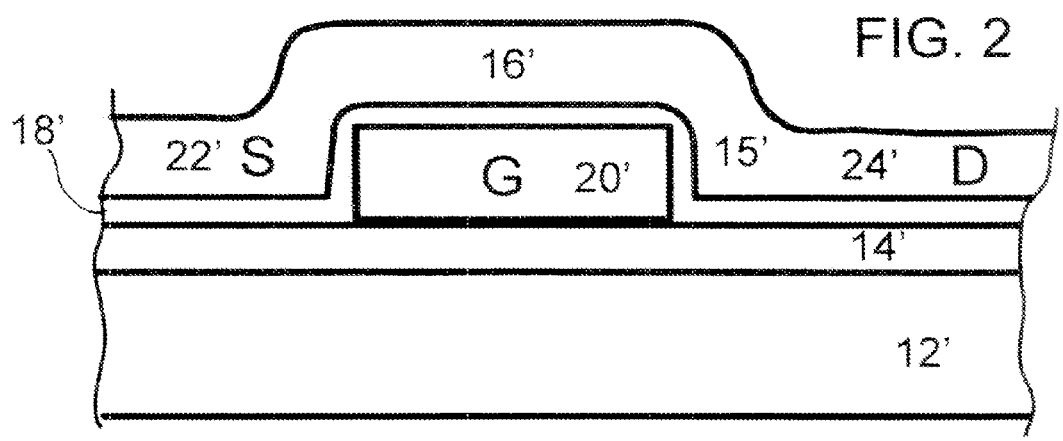
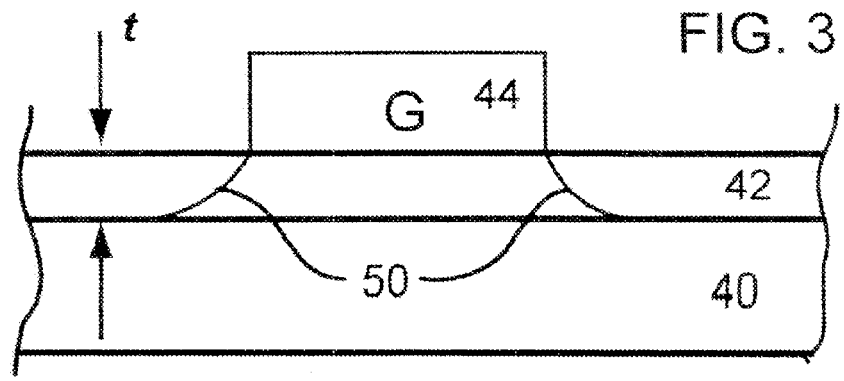

LASER ANNEALING OF METAL OXIDE SEMICONDUCTOR ON TEMPERATURE SENSITIVE SUBSTRATE FORMATIONS

FIELD OF THE INVENTION

This invention generally relates to amorphous metal oxide semiconductor material in semiconductor devices formed on temperature sensitive substrate formations and more specifically to annealing of the amorphous metal oxide semiconductor material for improved physical stability and performance while retaining the amorphous metal oxide semiconductor material amorphous.

BACKGROUND OF THE INVENTION

The figure of merit in thin film transistors (TFTs) is defined by $\mu V/L^2$ where $\mu$ is the mobility, V is the voltage and L is the gate length. A major problem is partially remedied by the recent advance in metal oxide semiconductor materials in which mobility as high as 80 cm$^2$/V-sec has been demonstrated. However, the metal oxide semiconductor material presently in use is amorphous and must remain amorphous for uniformity and/or reproducibility in the manufacture of multiple devices. Devices produced at low temperatures in many instances are not stable, exhibiting threshold shift under stress. Also, the amorphous metal oxide semiconductor material is physically unstable in that it has a tendency to change to polycrystalline material when heat is applied for a relatively long period of time. This physical stability can be improved by annealing at high temperature for short periods of time.

In the case of the amorphous metal oxide semiconductor material layer, the devices can be produced with more uniformity but the mobility may be less. Performance and physical stability can be increased by annealing. The mobility of TFTs, for example, and the subthreshold slope can also be improved by annealing. This is due to either or both the mobility of the amorphous metal oxide semiconductor or the gate dielectric/metal oxide interface improvement by the high temperature annealing. High temperature annealing reduces traps in the semiconductor/dielectric interface and in the semiconductor material itself, therefore, improving operating stability. For purposes of this disclosure, "operating stability" is defined in terms of the threshold voltage of the TFT, which should remain constant or stable throughout the lifetime. However, high temperature annealing can produce damage in the semiconductor device, i.e. to flexible substrates and/or other plastic layers in the device.

In many applications TFTs are formed on a substrate such as plastic, glass, polymer layers on glass (such as color filters), etc. (hereinafter referred to generically as a temperature sensitive substrate formation) which can only sustain a temperature of approximately 200° C. or less. In such applications it has been proposed that a pulsed ultraviolet (UV) laser provide the required heat. Metal oxide has a very large bandgap and can only absorb energy directly in the deep UV band. There are two major problems with this type of annealing procedure. One problem is that the temperatures can still be raised because of residual temperature absorption of the substrate, and temperature sensitive substrates, such as flexible or plastic substrates or other plastic layers such as color filters, will melt at this temperature. A second problem is that UV lasers are extremely expensive, causing this annealing method to be very expensive. It would be highly desirable to devise a method of low temperature annealing amorphous metal oxide semiconductor material in which the resulting grain sizes are small enough (i.e. remain amorphous) to improve the mobility as well as the reliability and uniformity of multiple TFTs formed therein.

It would be highly advantageous, therefore, to remedy the foregoing and other deficiencies inherent in the prior art.

Accordingly, it is an object of the present invention to provide a new and improved method of annealing an amorphous metal oxide semiconductor device on a temperature sensitive substrate.

It is another object of the present invention to provide a new and improved method of annealing metal oxide devices on temperature sensitive substrate formations that is low cost and easy to perform.

It is another object of the present invention to provide a new and improved method of annealing metal oxide devices on temperature sensitive substrate formations that improves the performance, reliability and uniformity of the semiconductor devices.

SUMMARY OF THE INVENTION

Briefly, to achieve the desired objects of the instant invention in accordance with a preferred embodiment thereof, provided is a method of annealing an amorphous metal oxide on a temperature sensitive substrate formation including the steps of providing a temperature sensitive substrate formation and forming a spacer layer on a surface of the temperature sensitive substrate formation. The method further includes the steps of forming a metal oxide semiconductor device on the spacer layer, the device including at least a layer of amorphous metal oxide semiconductor material, an interface of the amorphous metal oxide layer with a dielectric layer, and a gate metal layer adjacent the layer of amorphous metal oxide semiconductor material and the interface. A step of at least partially annealing the layer of amorphous metal oxide semiconductor material is then performed by heating the adjacent gate metal layer with short pulses of infra red radiation to improve the mobility, physical stability and the operating stability of the amorphous metal oxide semiconductor material while retaining the amorphous metal oxide semiconductor material amorphous.

The desired objects of the instant invention are further achieved in accordance with a preferred embodiment thereof wherein a metal oxide semiconductor device on a temperature sensitive substrate formation includes a temperature sensitive substrate formation that is formed of material which is substantially undamaged by temperatures below approximately 150° C. A spacer layer is positioned on a surface of the temperature sensitive substrate formation, which includes materials that can withstand temperatures in a range of 300° C. to 800° C. A metal oxide semiconductor device is positioned on the spacer layer, which includes at least a layer of amorphous metal oxide semiconductor material, an interface of the amorphous metal oxide layer with a dielectric layer, and a gate metal layer adjacent the layer of amorphous metal oxide semiconductor material and the interface. The layer of amorphous metal oxide semiconductor material and the interface are at least partially annealed with short pulses of infra red radiation to improve the mobility, operating stability and the physical stability of the amorphous metal oxide semiconductor material while retaining at least the amorphous metal oxide semiconductor material adjacent the gate metal layer amorphous.

BRIEF DESCRIPTION OF THE DRAWINGS

The foregoing and further and more specific objects and advantages of the instant invention will become readily
} apparent to those skilled in the art from the following detailed description of a preferred embodiment thereof taken in conjunction with the drawings in which:

FIG. 1 is a simplified drawing of a top gate thin film transistor on a temperature sensitive substrate formation, in accordance with the present invention;

FIG. 2 is a simplified drawing of a bottom gate thin film transistor on a temperature sensitive substrate formation, in accordance with the present invention; and FIG. 3 is a simplified diagram illustrating heat dissipation within the spacer layer on a temperature sensitive formation.

DETAILED DESCRIPTION OF A PREFERRED EMBODIMENT

A major problem in flexible TFT technology stems from the fact that semiconductor material that can be used in TFTs is severely limited by the maximum temperatures to which flexible or plastic containing substrates can be subjected. Layers of amorphous metal oxide semiconductor material can be formed at very low temperatures (e.g. room temperature). These amorphous metal oxide semiconductors have a relatively high mobility, i.e. compared to other semiconductor materials previously used on flexible substrates. Some unique features of metal oxide semiconductors are: (1) carrier mobility is less dependent on grain size of films, that is, high mobility amorphous metal oxide is possible; (2) density of surface states is low and enables easy field effect for TFTs, this is contrary to covalent semiconductors (such as Si or a-Si) where surface states have to be passivated by hydrogen; and (3) mobility strongly depends on the volume carrier density. However, the physical stability and reliability of the low temperature (amorphous) metal oxide is a serious problem. The physical stability of the low temperature metal oxide can be increased by annealing the metal oxide at higher temperatures for short periods of time to control the oxygen vacancies while substantially increasing the performance and reliability.

Traditionally, the volume carrier concentration in metal oxide is controlled by oxygen vacancies. The oxygen vacancies can be controlled by high temperature treatment, as in the present invention. However, a major deficiency of metal oxide semiconductors is the physical stability, defined herein as the tendency to become polycrystalline at higher process temperatures. Popular metal oxides, such as zinc oxide, indium zinc oxide, and indium gallium zinc oxide, are not very stable physically and become polycrystalline at moderate process temperatures (e.g. greater than approximately 400° C.) applied for extended periods of time. Polycrystalline semiconductor metal oxides are not desirable in multiple semiconductor devices on a common substrate for several reasons. For example, the characteristics of transistors formed in polycrystalline semiconductor metal oxides can vary, even between adjacent devices in an array, because of the variation in crystal size and position. For example, devices with micron to sub-micron length gates can have anywhere from one to several crystals adjacent the gate, which will change the characteristics of the devices substantially.

Annealing of the amorphous metal oxide semiconductor material reduces interface traps (semiconductor/dielectric interface) as well as bulk traps in the semiconductor material primarily by controlling the oxygen vacancies. It is understood that because the amorphous metal oxide semiconductor layer is deposited at very low temperatures (e.g. room temperature) oxygen vacancies in many instances are in a substantial imbalance. Annealing controls the oxygen vacancies to bring the material into closer balance. To achieve the best annealing while ensuring that temperature sensitive substrates, such as flexible substrates or substrates containing plastic, are not damaged, it is preferable to limit the substrate temperature to below approximately 150° C. while the metal oxide temperature is raised to over 300° C. Also, it is imperative that the amorphous metal oxide semiconductor material remain amorphous (at least adjacent the gates of any semiconductor devices) after the annealing step. That is no polycrystalline metal oxide semiconductor material is produced adjacent the gates or, stated differently, in the conduction area.

Turning now to FIG. 1, a simplified drawing of a top gate thin film transistor 10 on a temperature sensitive substrate formation 12 is illustrated. Temperature sensitive substrate formation 12 is generally formed to include plastic or other flexible material that has a relatively low melting point. For example, formation 12 may be a flexible substrate, or may be another substrate, such as glass, with one or more layers of plastic or other heat sensitive material thereon. In the method of the present invention a thin spacer layer 14 of low cost material is deposited on the upper surface of temperature sensitive substrate formation 12. Spacer layer 14 is flexible because it is relatively thin, preferably less than approximately 10 microns thick, and is selected from a material that can withstand a higher temperature than formation 12 and which is relatively inexpensive. Examples of materials that are preferable for spacer layer 14 include $SiO_2$, SiN, polyimide, or BCB. These materials can withstand temperatures in a range of 300° C. to 800° C. without damage. While any of these materials might be too expensive to use in the formation of the entire substrate, the slightly more expensive materials can be economically used to form the relatively thin spacer layer.

The formation of TFT 10 follows a well known procedure generally including at least the following steps. A layer 15 of amorphous metal oxide is deposited on spacer layer 14 at temperatures as low as room temperature. In a preferred embodiment amorphous metal oxide layer 15 is deposited by a method such as physical vapor deposition or a solution process. A physical vapor deposition process may be, for example, sputtering and solution processes include processes such as spin coating, dip coating, inkjet printing, screen printing, Gravure printing, and the like.

A gate dielectric layer 18 is deposited on the upper surface of amorphous metal oxide layer 15 and a gate stack including gate metal 20 is formed on gate dielectric layer 18. Source 22 and drain 24 are formed in layer 15 by some convenient method including, for example, a self-aligned procedure. An active or conductive path or area 16 is defined in layer 15 between source 22 and drain 24 as understood in the art. As an example of this process see the copending United States patent application entitled "Self-Aligned Transparent Metal Oxide TFT on Flexible Substrate", filed Dec. 3, 2007, with application Ser. No. 11/949,477 and included herein by reference. Gate metal 20 includes at least a contact layer of metal that is very close to metal oxide layer 24 and the gate dielectric/metal oxide interface, designated 26. TFT 10 is illustrated with an encapsulation layer 30 covering and encapsulating the device in a well known manner.

To perform an annealing step on amorphous metal oxide layer 15, TFT 10 is subjected to short pulses of radiation from an infra red (IR) laser, illustrated as arrows 32. Inexpensive IR semiconductor lasers, generally used for industrial applications, are readily available in the market. While amorphous metal oxide layer 15 is transparent to IR radiation, metals such as gate contact metal 20 readily absorb the waves and are heated. In the preferred embodiment, gate metal 20 is irradiated by IR waves 32 which are applied, for example, in less than 50 nanosecond pulses separated by greater than one micro second intervals, sufficiently to achieve the desired temperature. It is well known that lasers are pulsed at very high frequencies for proper operation but the frequency of the pulses is so high the radiation produced is considered a substantially constant beam. Because the particles of amorphous metal oxide have a tendency to be excited into a polycrystalline form when heat is applied substantially continuously for extended periods of time, the normal high frequency pulses of an operating laser are not sufficiently separated to produce breaks in the radiation or pulses of heating and the amorphous metal oxide is converted to a polycrystalline form.

Using this IR pulsing process, gate metal 20 can be quickly and easily heated to a temperature in a range of 300° C. to 800° C. with the heat being transferred substantially directly to amorphous metal oxide layer 15 for annealing thereof. By using short pulses of laser radiation, the energy is absorbed in or near amorphous metal oxide semiconductor layer 15 and the spatial and temporal diffusion of the heat creates a big temperature difference between the absorption region and substrate formation 12. Also, spacer layer 14 between the heat absorption region and substrate formation 12 further enhances the temperature difference. Spacer layer 14 is made of inexpensive material that can sustain higher temperatures. Because of the heat diffusion in the spatial and temporal domain, the peak temperature in amorphous metal oxide semiconductor layer 15 can be much higher (300° C. to 800° C.) than the temperature of flexible substrate 12 (less than 150° C.). Also, because the amorphous metal oxide is irradiated by IR waves in short pulses separated by greater than one micro second intervals the amorphous metal oxide grain sizes remain small (remain amorphous) and do not flow together (i.e. are not speeded-up or excited) into a polycrystalline material.

Here it will be understood by those skilled in the art that the present novel method can also be used on a variety of different semiconductor devices formed on temperature sensitive substrate formations, including for example a typical vertical metal oxide diode structure with the ohmic contact metal serving as a heat absorbing layer. Also, while the above embodiment is performed with encapsulation layer 30 covering and encapsulating TFT 10 it will be understood that it can be performed at anytime subsequent to the formation of the metal contact layer.

Turning now to FIG. 2, a simplified drawing of a bottom gate thin film transistor 10' on a temperature sensitive substrate formation 12' is illustrated. Temperature sensitive substrate formation 12' is generally formed to include plastic or other flexible material that has a relatively low melting point. For example, formation 12' may be a flexible substrate, or maybe another substrate, such as glass, with one or more layers of plastic material thereon. A specific example of a glass substrate with a plastic layer thereon is a color filter on the substrate, making it a temperature sensitive substrate formation. In the method of the present invention a thin spacer layer 14' of low cost material is deposited on the upper surface of temperature sensitive substrate formation 12'. Spacer layer 14' is flexible because it is relatively thin, preferably less than approximately 10 microns thick, and is selected from a material that can withstand a higher temperature than formation 12' and which is relatively inexpensive. Examples of materials that are preferable for spacer layer 14 include $SiO_2$, SiN, polyimide, or BCB. These materials can withstand temperatures in a range of 300° C. to 800° C. without damage. While any of these materials might be too expensive to use in the formation of the entire substrate, the slightly more expensive materials can be economically used to form the relatively thin spacer layer.

The formation of TFT 10' follows a well known procedure generally including at least the following steps. A gate stack including gate metal 20' is formed on spacer layer 14' in any of the well known processes. In some instances, in a bottom gate configuration the gate may be planarized to enhance further operations. A gate dielectric layer 18' is deposited on the upper surface of gate metal 20' and the planarization surface, if present, or spacer layer 14', if not present (as illustrated). A layer 15' of amorphous metal oxide is deposited on the upper surface of gate dielectric layer 18' at temperatures as low as room temperature. Source 22' and drain 24' are formed by some convenient method including, for example, a self-aligned procedure (illumination from the bottom if formation 12' is transparent to the radiation used) in layer 15'. An active or conductive path or area 16' is defined in layer 15' between source 22' and drain 24', as understood in the art. As an example of this process see the copending United States patent application entitled "Self-Aligned Transparent Metal Oxide TFT on Flexible Substrate", filed Dec. 3, 2007, with application Ser. No. 11/949,477 and included herein by reference. As explained above, it is imperative to uniformity and reliability that layer 15' remain amorphous at least throughout conductive path or area 16'.

Referring to FIG. 3, a simplified diagram illustrating heat dissipation within the spacer layer on a temperature sensitive formation is provided. Simply for purposes of this explanation, a temperature sensitive substrate formation 40 is illustrated with a spacer layer 42 formed or deposited thereon. A formation including gate metal 44 is illustrated in a position on the surface of spacer layer 42, as in the bottom gate structure of FIG. 2, but it will be understood that gate metal 44 might be separated from spacer layer 42 by an amorphous metal oxide semiconductor layer, as in the embodiment illustrated in FIG. 1. In the present annealing process, gate metal 44 is heated by short pulses of infra red radiation. The short pulses of radiation raise the temperature of gate metal 44 sufficiently to heat the adjacent amorphous metal oxide to a temperature generally in a range of 300° C. to 800° C. The heat also has a tendency to travel downwardly toward temperature sensitive substrate formation 40. To this end spacer layer 42 is positioned to receive the heat from gate metal 44 and dissipate it outwardly, roughly as indicated by lines 50. The number and duration of pulses of infra red radiation and the material and thickness 't' of spacer layer 42 are selected such that the temperature at the upper surface of spacer layer 42 may be in the range of 300° C. to 800° C. while the temperature at the junction or interface of spacer layer 42 with temperature sensitive substrate formation 40 is less than 150° C.

In this preferred embodiment (either the structure of FIG. 1 or FIG. 2) it will be understood that the annealing process described heats the amorphous metal oxide semiconductor material sufficiently (i.e. controls oxygen vacancies) to reduce traps and the like and, thereby improve reliability and performance and to at least partially improve mobility. Here it will be understood that the annealing step, that is the amount of annealing ultimately performed, will be determined by the specific amorphous metal oxide used and the specific formation of the material. It should further be understood that it is imperative to uniformity that the amorphous metal oxide semiconductor material remain amorphous at least throughout the conductive path or area of the semiconductor device.

Thus, a new and improved method of annealing a layer of amorphous metal oxide semiconductor material in a semiconductor device formed on a flexible substrate has been disclosed. The new and novel method of annealing amorphous metal oxide devices on flexible substrates is low cost and easy to perform. The annealing step heats the amorphous metal oxide semiconductor material sufficiently to control oxygen vacancies so that amorphous metal oxide semiconductor devices can be produced with greatly improved performance and reliability. Also, the annealing step heats the amorphous metal oxide to produce a structure with less defects and with improved mobility and subthreshold slope. Further, the annealing produces a gate dielectric/metal oxide interface that is improved because traps are eliminated both at the interface and within the semiconductor material. All of which occurs while retaining the amorphous metal oxide semiconductor material amorphous at least throughout the conductive path or area of the semiconductor device.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of annealing an amorphous metal oxide on a temperature sensitive substrate formation comprising the steps of:
   providing a temperature sensitive substrate formation;
   forming a spacer layer on a surface of the temperature sensitive substrate formation;
   forming a metal oxide semiconductor device on the spacer layer, the device including at least a layer of amorphous metal oxide semiconductor material, an interface of the amorphous metal oxide layer with a dielectric layer, and a contact metal layer adjacent the layer of amorphous metal oxide semiconductor material and the interface; and
   improving the mobility and operating stability of the amorphous metal oxide semiconductor material while retaining at least the amorphous metal oxide semiconductor material adjacent the contact metal layer amorphous by at least partially annealing the layer of amorphous metal oxide semiconductor material by heating the adjacent contact metal layer with pulses of infra red radiation, the pulses being produced by pulsing an infra-red laser to produce breaks or intervals between radiation or pulses of heating, the intervals being longer than the pulses of heating.

2. A method as claimed in claim 1 wherein the temperature sensitive substrate formation includes plastic.

3. A method as claimed in claim 1 wherein the temperature sensitive substrate formation includes a color filter.

4. A method as claimed in claim 1 wherein the step of forming the spacer layer includes forming the spacer layer with a thickness less than 10 microns.

5. A method as claimed in claim 1 wherein the step of improving the mobility and operating stability of the amorphous metal oxide semiconductor material includes controlling the volume carrier concentration in the amorphous metal oxide semiconductor material by controlling oxygen vacancies in the amorphous metal oxide semiconductor material through the heating of the adjacent contact metal layer.

6. A method as claimed in claim 1 wherein the amorphous metal oxide semiconductor device formed includes one of a thin film transistor and a vertical diode.

7. A method as claimed in claim 1 wherein the spacer layer is formed of material capable of withstanding a higher heat than the temperature sensitive substrate formation.

8. A method as claimed in claim 7 wherein the spacer layer is formed of one of $SiO_2$, SiN, polyimide, and BCB.

9. A method as claimed in claim 1 wherein the step of heating includes using an infra red semiconductor laser and pulsing the laser to produce radiation or pulses of heating each having a duration of less than 50 nanoseconds.

10. A method as claimed in claim 9 wherein the infra red semiconductor laser breaks or intervals between radiation or pulses of heating are each longer than one micro second.

11. A method as claimed in claim 1 wherein the step of forming the spacer layer includes using a material that is capable of withstanding a temperature in a range of 300° C. to 800° C.

12. A method as claimed in claim 11 wherein the step of heating includes heating the metal contact layer to a temperature in a range of 300° C. to 800° C.

13. A method as claimed in claim 12 wherein the flexible substrate is heated to a temperature less than 150° C.

14. A method as claimed in claim 12 wherein the at least partially annealing step reduces traps in the amorphous metal oxide semiconductor material and the interface.

15. A method as claimed in claim 1 wherein the step of forming a metal oxide semiconductor device includes a step of depositing a metal oxide layer by one of physical vapor deposition and a solution process.

16. A method as claimed in claim 15 wherein the step of depositing the metal oxide layer by physical vapor deposition includes sputtering.

17. A method as claimed in claim 15 wherein the step of depositing the metal oxide layer by solution process includes one of spin coating, dip coating, inkjet printing, screen printing, and Gravure printing.

18. A method of annealing an amorphous metal oxide on a temperature sensitive substrate formation comprising the steps of:
   providing a temperature sensitive substrate formation, the temperature sensitive substrate formation being formed of material that is substantially undamaged by temperatures below approximately 150° C.;
   forming a spacer layer on a surface of the temperature sensitive substrate formation, the spacer layer including materials that can withstand temperatures in a range of 300° C. to 800° C.;
   forming a metal oxide semiconductor device on the spacer layer, the device including at least a layer of amorphous metal oxide semiconductor material, an interface of the amorphous metal oxide layer with a dielectric layer, a gate metal layer adjacent the layer of amorphous metal oxide semiconductor material and the interface, and a conduction area defined in the amorphous metal oxide semiconductor material extending substantially the length of the gate metal layer; and
   improving the mobility and operating stability of the amorphous metal oxide semiconductor material while retaining all of the amorphous metal oxide semiconductor material in the conduction area amorphous by at least partially annealing the layer of amorphous metal oxide semiconductor material by heating the gate metal layer with pulses of infra red radiation to a temperature in a range of 300° C. to 800° C., the pulses being produced by pulsing an infra-red laser to produce breaks or intervals between radiation or pulses of heating, the intervals being longer than the pulses of heating.

19. A method as claimed in claim 18 wherein the temperature sensitive substrate formation includes plastic.

20. A method as claimed in claim 18 wherein the temperature sensitive substrate formation includes a color filter.

21. A method as claimed in claim 18 wherein the step of forming the spacer layer includes forming the spacer layer with a thickness less than 10 microns.

22. A method as claimed in claim 18 wherein the metal oxide semiconductor device formed includes one of a thin film transistor and a vertical diode.

23. A method as claimed in claim 18 wherein the step of heating includes using an infra red semiconductor laser and pulsing the laser to produce radiation or pulses of heating each with a duration of less than 50 nanoseconds.

24. A method as claimed in claim 23 wherein the infra red semiconductor laser breaks or intervals between radiation or pulses of heating are each longer than one micro second.

* * * * *